(12) United States Patent
Maszara

(10) Patent No.: US 7,306,998 B2
(45) Date of Patent: Dec. 11, 2007

(54) FORMATION OF ABRUPT JUNCTIONS IN DEVICES BY USING SILICIDE GROWTH DOPANT SNOWPLOW EFFECT

(75) Inventor: Witold P. Maszara, Morgan Hill, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 15 days.

(21) Appl. No.: 11/422,811

(22) Filed: Jun. 7, 2006

(65) Prior Publication Data

US 2006/0211245 A1 Sep. 21, 2006

Related U.S. Application Data

(62) Division of application No. 10/727,999, filed on Dec. 3, 2003, now Pat. No. 7,081,655.

(51) Int. Cl.
*H01L 21/336* (2006.01)

(52) U.S. Cl. ............. 438/300; 438/216; 438/281; 438/283; 438/285; 438/290; 438/294; 438/295; 438/296; 438/299; 438/302; 257/347; 257/349; 257/350; 257/E21.151; 257/E21.199

(58) Field of Classification Search ........... 438/216, 438/281, 283, 285, 294, 295
See application file for complete search history.

(56) References Cited

U.S. PATENT DOCUMENTS

| 4,274,892 A | 6/1981 | Templin |
|---|---|---|
| 4,293,587 A | 10/1981 | Trueblood |
| 4,356,622 A | 11/1982 | Widmann |
| 4,362,597 A | 12/1982 | Fraser et al. |
| 4,692,348 A | 9/1987 | Rubloff et al. |
| 4,769,686 A | 9/1988 | Horiuchi et al. |
| 4,885,617 A | 12/1989 | Mazure-Espejo et al. |
| 5,352,631 A | 10/1994 | Sitaram et al. |
| 6,087,235 A * | 7/2000 | Yu .............................. 438/300 |
| 6,136,636 A | 10/2000 | Wu |

(Continued)

OTHER PUBLICATIONS

Bruno Studer, "Barrier Height Control of Pd2 Si/Si Schottky Diodes Using Diffusion from Doped Pd," Solid-State Electronic, Nov. 1980, pp. 1181-1184, vol. 23, Issue 11, Elsevier Science Ltd.

(Continued)

*Primary Examiner*—Michael Lebentritt
*Assistant Examiner*—Kyoung Lee
(74) *Attorney, Agent, or Firm*—Mikio Ishimaru

(57) ABSTRACT

A method of forming an abrupt junction device with a semiconductor substrate is provided. A gate dielectric is formed on a semiconductor substrate, and a gate is formed on the gate dielectric. A sidewall spacer is formed on the semiconductor substrate adjacent the gate and the gate dielectric. A thickening layer is formed by selective epitaxial growth on the semiconductor substrate adjacent the sidewall spacer. Raised source/drain dopant implanted regions are formed in at least a portion of the thickening layer. Silicide layers are formed in at least a portion of the raised source/drain dopant implanted regions to form source/drain regions, beneath the silicide layers, that are enriched with dopant from the silicide layers. A dielectric layer is deposited over the silicide layers, and contacts are then formed in the dielectric layer to the silicide layers.

12 Claims, 4 Drawing Sheets

U.S. PATENT DOCUMENTS 6,326,251 B1    12/2001    Gardner et al.
6,451,693 B1     9/2002    Woo et al.
6,812,527 B2    11/2004    Dennard et al.

OTHER PUBLICATIONS

Jie J. Sun, "Elevated n+/p Junctions by Implant into CoSi2 Formed on Selective Epitaxy for Deep Submicron MOSFET's," IEEE Transactions on Electron Devices, Sep. 1998, pp. 1946-1952, vol. 45, No. 9.

M. Wittmer, C.-Y. Ting, I. Ohdomari and K. N. Tu, "Redistribution of As during Pd2Si formation: Ion channeling measurments," Journal of Applied Physics, Oct. 1982, pp. 6781-6787, vol. 53, No. 10, American Institute of Physics, New York, USA.

Masatada Horiuchi and Ken Yamaguchi, "SOLID-II: High-Voltage High-Gain kilo-Angstrom-Channel-Length CMOSFET's Using Silicide with Self-Aligned Ultrashallow (3S) Junction," IEEE Transactions on Electron Devices, Feb. 1986, vol. ED-33, No. 2, IEEE, New York, USA.

H. Kotaki, M. Nakano, Y. Takegawa, S. Kakimoto, Y. Mori, K. Mitsuhashi, J. Takagi, S. Tsuchimoto and Y. Akagi, "Novel Elevated Silicide Source / Drain (ESSOD) by Load-Lock LPCVD-Si and Advanced Silicidation Processing,".

A. Hokazono, K. Ohuchi, K. Miyano, I. Mizushima, Y. Tsunashima and Y. Toyoshima, "Source/Drain Engineering for Sub-100 nm CMOS Using Selective Epitaxial Growth Technique,".

S. P. Murarka, D. S. Williams, "Dopant redistribution in silicide-silicon and silicide-polychrystallin silicon bilayered structures," Journal of Vacuum Science & Technology / Section B5, Nov./Dec. 1987, p. 1674-1688, No. 6 +index, Woodbury, NY, USA.

H. Jiang, C.M. Osburn, Z-G. Xiao, G. McGuire, G. A. Rozgonyi, B. Patnaik, N. Parikh and M. Swanson, "Ultra Shallow Junction Formation Using Diffusion from Silicides: II Diffusion in Silicides and Evaporation," Journal of the Electrochemical Society, Jan. 1992, p. 206-211, No. 1, Manchester, NH, USA.

\* cited by examiner

US 7,306,998 B2

FORMATION OF ABRUPT JUNCTIONS IN DEVICES BY USING SILICIDE GROWTH DOPANT SNOWPLOW EFFECT

CROSS-REFERENCE TO RELATED APPLICATION(S)

This is a divisional of U.S. patent application Ser. No. 10/727,999 filed Dec. 3, 2003 now U.S. Pat. No. 7,081,655.

BACKGROUND

1. Technical Field

The present invention relates generally to semiconductor technology, and more specifically to siliciding in semiconductor devices to form abrupt junctions by a silicide growth dopant snowplow effect.

2. Background Art

Integrated circuits are made up of hundreds to millions of individual components. One common component is the semiconductor transistor. The most common and important semiconductor technology presently used is silicon-based, and the most preferred silicon-based semiconductor device is a Metal Oxide Semiconductor ("MOS") transistor.

The transistor contains a gate electrode (usually polysilicon) over a gate dielectric, over a silicon substrate. The silicon substrate on both sides of the polysilicon gate is doped by ion implantation of boron or phosphorus or other impurity atoms into the surface of the silicon substrate, thereby becoming conductive. These doped regions of the silicon substrate are referred to as "shallow source/drain junctions", which are separated by a channel region beneath the polysilicon gate.

A silicon oxide or silicon nitride spacer, referred to as a "sidewall spacer", on the sides of the polysilicon gate allows deposition of additional doping to form more heavily doped regions of the shallow source/drain junctions, which are called "deep source/drain junctions". The shallow and deep source/drain junctions are collectively referred to as "S/D junctions".

To complete the transistor, a silicon oxide dielectric layer is deposited to cover the gate, the spacer, and the silicon substrate. To provide electrical connections for the transistor, openings are etched in the silicon oxide dielectric layer to the polysilicon gate and the S/D junctions. The openings are filled with metal to form electrical contacts. To complete the integrated circuits, the contacts are connected to additional levels of wiring in additional levels of dielectric material to the outside of the dielectric material.

As transistors have decreased in size, it has been found that the electrical resistance between the metal contacts and the silicon substrate or the polysilicon has increased to the level where it negatively impacts the performance of the transistors. To lower the electrical resistance, a transition material is formed between the metal contacts and the silicon substrate or the polysilicon. The best transition materials have been found to be cobalt silicide ($CoSi_2$) and nickel silicide ($NiSi_2$).

The silicides are formed by first applying a thin layer of the cobalt (Co) or nickel (Ni) on the silicon substrate above the S/D junctions and the polysilicon gates. The semiconductor wafer is subjected to one or more annealing steps at temperatures below 800° C. and this causes the cobalt or nickel to selectively react with the silicon and the polysilicon to form the metal silicide. The process is generally referred to as "siliciding".

Transistors used in integrated circuits are accordingly made ever smaller as the complexity and packing density of those circuits continue to increase. Those transistors use p-n junctions, which are formed in semiconductor substrates by controlled introduction of one or more of the dopant species in selected areas. Modern, scaled down, high performance devices require these junctions to be shallow and abrupt.

Such junctions, as they are formed by the ion implantation, have ion distribution patterns or profiles in the substrate that are determined by the ion implantation parameters and the substrate properties. Such ion distributions have a finite (i.e., limited) sharpness or abruptness at their edges. The abruptness is then dulled as the dopant undergoes thermal annealing to make it electrically active in the substrate. Such limited abruptness of the dopant profile, and in particular the limited abruptness of the active portion of the dopant profile, poses limitations on the scalability of such devices to very small sizes.

Various methods have been proposed to sharpen the activated dopant profile at the source and drain junctions. These include solid-phase epitaxial regrowth of a preamorphized part of the doped area, as well as shallow and rapid melting of that area by lasers. In both cases, achieved active dopant profiles at the junction can become sharper than the profiles as originally implanted. However, these are complex processes with inherent limitations, and have not fully met the need for better and improved solutions.

Solutions to such problems have been long sought but prior developments have not taught or suggested solutions and, thus, solutions to these problems have long eluded those skilled in the art.

DISCLOSURE OF THE INVENTION

The present invention provides devices having abrupt junctions, and a method for the formation thereof A gate dielectric is formed on a semiconductor substrate, and a gate is formed on the gate dielectric. A sidewall spacer is formed on the semiconductor substrate adjacent the gate and the gate dielectric. A thickening layer is formed by selective epitaxial growth on the semiconductor substrate adjacent the sidewall spacer. Raised source/drain dopant implanted regions are formed in at least a portion of the thickening layer. Silicide layers are formed in at least a portion of the raised source/drain dopant implanted regions to form source/drain regions, beneath the silicide layers, that are enriched with dopant from the silicide layers. A dielectric layer is deposited over the silicide layers, and contacts are then formed in the dielectric layer to the silicide layers. The method thus furnishes a highly efficient and economical ion implantation and siliciding method for the formation of abrupt, shallow, high concentration integrated circuit source and drain junctions.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
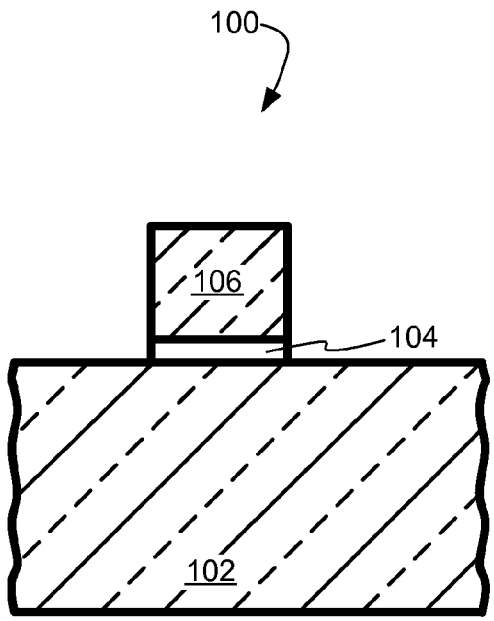
FIG. 1 is a view of a transistor in an intermediate stage of fabrication in accordance with the present invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers are used in all the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

In the formation of integrated circuit devices, the source/drain ("S/D") junctions of scaled devices are very shallow. They therefore need to have very steep dopant profiles to enable high performance. As taught herein, it has been discovered that dopant profiles can be generated that are steeper than the profiles of the originally implanted dopants.

As taught by the present invention, dopant rejection from growing silicide is employed to steepen the dopant profiles. More specifically, silicide is grown into the silicon in S/D junction implanted regions. As the silicide grows into the silicon, the silicide rejects the dopant in the silicon and pushes the dopant along in front of the silicide. The rejection of the dopant is due to the limited solid solubility of dopants in silicides, and to the related segregation thereof at the silicide-silicon interface.

In one embodiment, the transistor is formed with S/D regions that are first thickened by selective epitaxial growth ("SEG" or "epi"). S/D regions are then formed in the thickened S/D regions by implanting them with a desired initial concentration of dopant; e.g., arsenic (As) or boron (B). Part of the dopant is then snowplowed by growing silicide; e.g., cobalt silicide ($CoSi_2$) or nickel silicide (NiSi) on top of the epi layer. As the silicide grows downwardly into the silicon, it injects excess dopant into the silicon in front of it.

Referring now to FIG. 1, therein is shown a semiconductor device, and in particular a transistor 100 in an intermediate stage of fabrication in accordance with the present invention.

To form the intermediate stage, a gate dielectric layer, such as silicon oxide, and a conductive gate layer, such as polysilicon, have been deposited on a semiconductor substrate 102 of a material such as silicon. The layers are patterned and etched to form a gate dielectric 104 and a gate 106.

Figure 2:
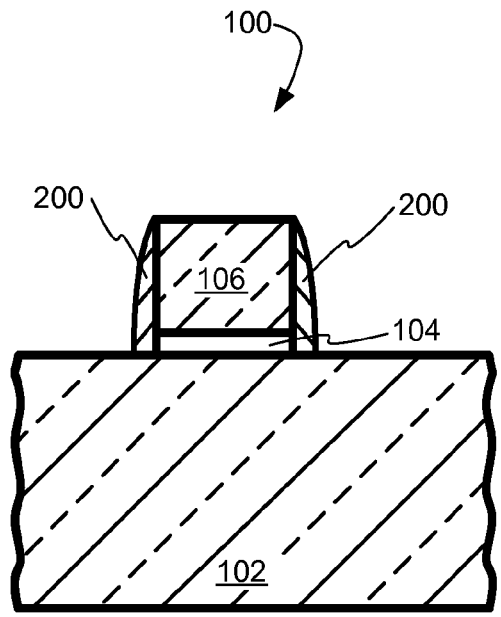
FIG. 2 is the structure of FIG. 1 after deposition and etching to form a sidewall spacer.
Figure 6:
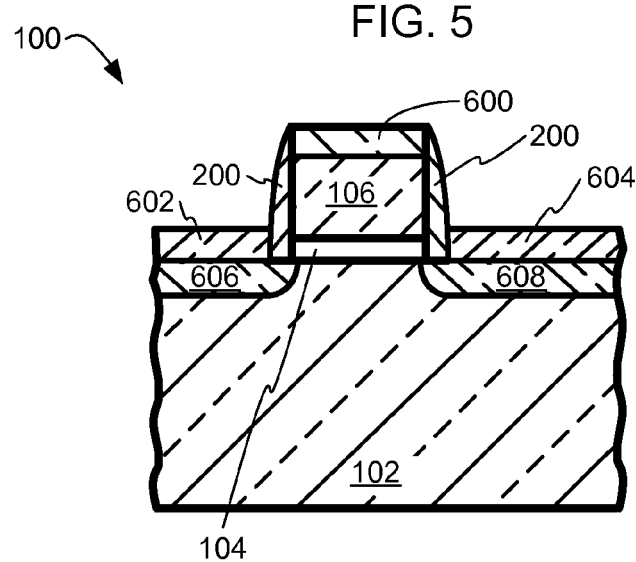
FIG. 6 is the structure of FIG. 5 during the formation of silicide layers.

Referring now to FIG. 2, therein is shown the structure of FIG. 1 after deposition and etching of a sidewall spacer layer, typically of silicon nitride, to form a sidewall spacer 200. The sidewall spacer 200 prevents the epi (see next paragraph) from shorting the S/D regions 606 and 608 (see FIG. 6) and the gate 106. As can be seen, the sidewall spacer 200 is quite thin, to allow the S/D regions 606 and 608 to be very close to the edge of the gate 106 (as illustrated in FIG. 6).

Figure 3:
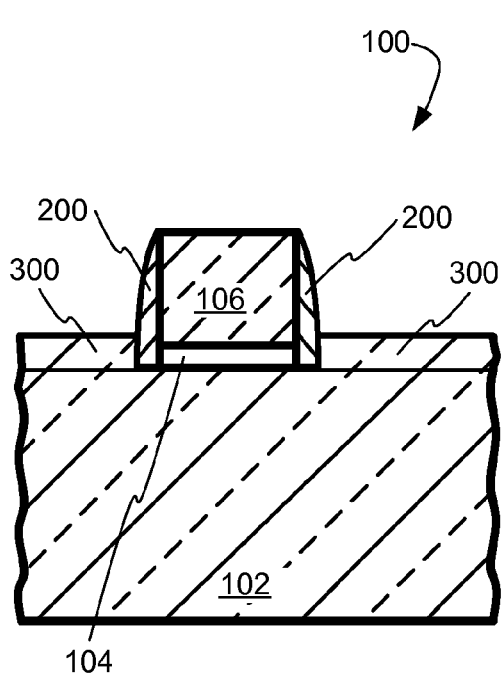
FIG. 3 is the structure of FIG. 2 following formation of a thickening layer on the surface of the semiconductor substrate.

Referring now to FIG. 3, therein is shown the structure of FIG. 2 following formation by SEG of a thickening layer 300 on the surface of the semiconductor substrate 102 adjacent the sidewall spacer 200 and the gate 106. The thickening layer 300 raises the level or height of the surface of the semiconductor substrate adjacent the sidewall spacer 200 and the gate 106, providing for the formation of raised structures thereadjacent.

Figure 4:
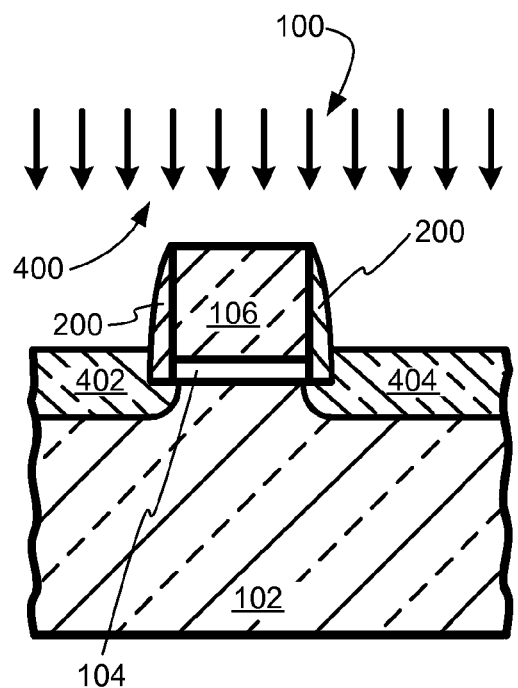
FIG. 4 is the structure of FIG. 3 during formation of raised source/drain dopant implanted regions in the thickening layer and the adjacent top of the semiconductor substrate.

Referring now to FIG. 4, therein is shown the structure of FIG. 3 during a dopant ion implantation 400 to form such a raised structure. In particular, the dopant ion implantation 400 forms raised S/D dopant implanted regions 402 and 404 in the thickening layer 300 (FIG. 3) and the adjacent top of the semiconductor substrate 102. The gate 106 and the sidewall spacer 200 act as masks for the formation of the raised S/D dopant implanted regions 402 and 404. The dopant ion implantation 400 is then followed by a high-temperature anneal (e.g., above 700° C.) to activate the implanted impurity atoms in the raised S/D dopant implanted regions 402 and 404.

Dopants that may be used for the raised S/D dopant implanted regions 402 and 404 include: arsenic (As), phosphorus (P), and antimony (Sb) for NMOS devices, and boron (B) and indium (In) for PMOS devices.

Figure 5:
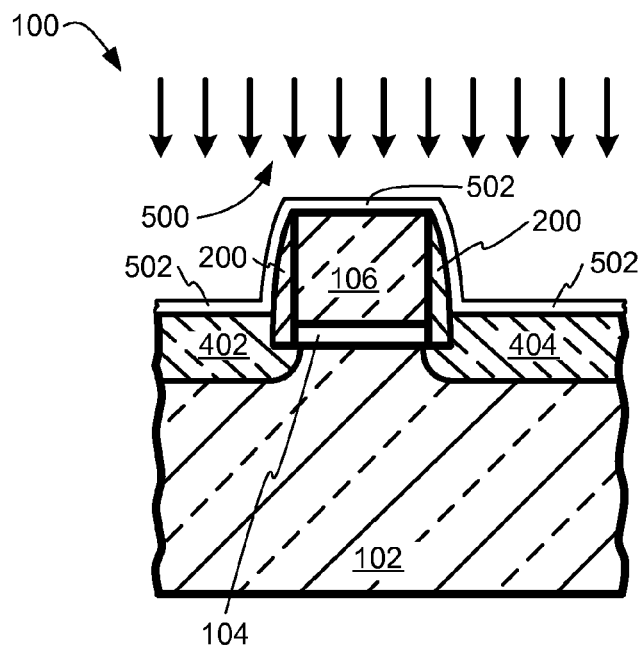
FIG. 5 is the structure of FIG. 4 during formation of metallic layers on the gate and the raised source/drain dopant implanted regions.

Referring now to FIG. 5, therein is shown a deposition process 500 that forms a metallic layer 502 on the gate 106 and on the raised S/D dopant implanted regions 402 and 404, respectively. For example, and as appropriate for the choice of dopants, the metallic layer 502 may be formed of cobalt (Co), nickel (Ni), titanium (Ti), hafnium (Hf), or platinum (Pt).

Referring now to FIG. 6, therein is shown the formation of silicide layers 600, 602, and 604 in accordance with the present invention. The silicide layers 600, 602, and 604 are formed by thermal silicidation of the metallic layer 502 (FIG. 5) into the silicon material of the gate 106 and the raised S/D dopant implanted regions 402 (FIG. 5) and 404 (FIG. 5), respectively. After the thermal silicidation anneal, any residual metal remaining from the metallic layer 502 is etched away in conventional manner.

As the silicide grows downwardly into the raised S/D dopant implanted regions 402 and 404, it injects excess dopant from the prior dopant ion implantation 400 (FIG. 4) into the silicon in front of the downwardly growing silicide layers 602 and 604. This occurs because the solubility of the dopant in silicide is far less than the solubility of the dopant in silicon. As a result, the remaining portions of the S/D dopant implanted regions 402 and 404, beneath the silicide layers 602 and 604, become highly enriched with the dopant. These remaining portions of the S/D dopant implanted regions 402 and 404, beneath the silicide layers 602 and 604, then become respective S/D regions 606 and 608 for the transistor 100.

The S/D regions 606 and 608 have the virtue not only of being highly enriched with dopant from the silicide layers, but also of being very shallow. Accordingly, they present an abrupt, very steep dopant profile, steeper than the profile of the dopant as it was originally implanted and annealed, and similarly steeper than the profile of dopant that lacks enrichment from the silicide layers. This steeper dopant profile is the dopant profile that is needed to enable high performance in shallow, scaled devices.

Figure 7:
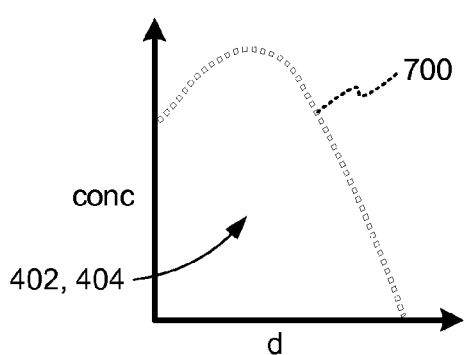
FIG. 7 is a graphical representation of the profile of the dopant concentration as originally implanted.

Referring now to FIG. 7, therein is shown a graphical representation of the profile 700 of the dopant concentration as it was originally implanted and annealed in the raised S/D dopant implanted regions 402 and 404. As will be conventionally understood, the vertical axis (labeled "conc") represents the dopant concentration, while the horizontal axis (labeled "d") represents the depth below the surface of the raised S/D dopant implanted regions 402 and 404.

Figure 8:
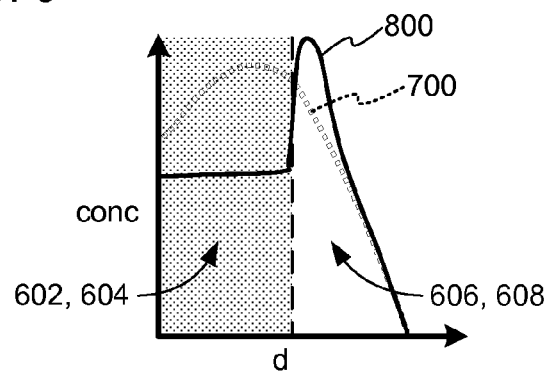
FIG. 8 is a graphical representation of the profile of the dopant concentration following formation of the silicide layers and the source/drain regions.

Referring now to FIG. 8, therein is shown a graphical representation, similar to FIG. 7, of the profile 800 of the dopant concentration following the formation of the silicide layers 602 and 604, and the S/D regions 606 and 608.

In one embodiment, the silicidation described in connection with FIG. 6 is performed at a low enough temperature that the dopant segregation or plowing effect into the S/D regions 606 and 608 dominates any dopant diffusion within the silicon of the S/D regions 606 and 608 themselves. This preserves and sharpens the dopant profile in the S/D regions 606 and 608. In fact, by keeping the silicidation temperature sufficiently low, dopant diffusion within the S/D regions and the adjacent silicon substrate can be kept essentially non-existent.

The epi deposition of the thickening layer 300 (FIG. 3) allows the silicide layers 602 (FIG. 6) and 604 (FIG. 6) to be much thicker, thereby lessening parasitic S/D resistance. Accordingly, the epi deposition should preferably be as thick as possible to produce a correspondingly thick silicide. On the other hand, the epi deposition cannot be too thick or it may create excessive capacitance with the gate 106.

It is believed that an advantage of the present invention is that, as the silicide grows, it may inject more than just excess dopant into the silicon in front of it. It may also inject vacancies into the silicon in front of it that improve the chances of dopant ending up in substitutional sites of the silicon lattice, and thus becoming activated. Consequently, not only is a steeper and richer dopant profile obtained, but the dopant activation may also be more complete.

Figure 9:
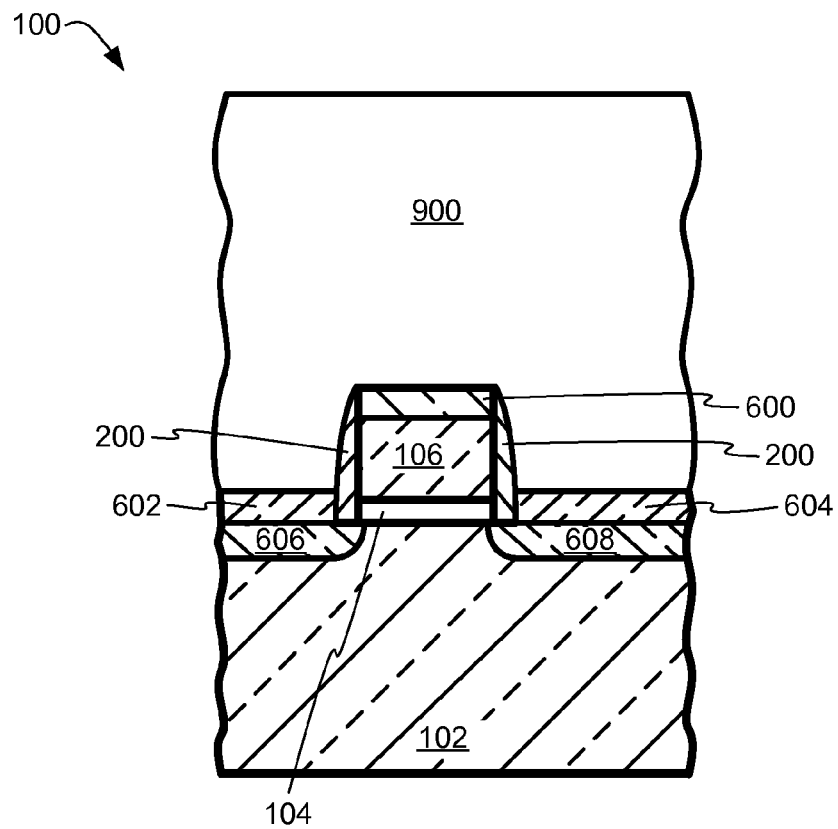
FIG. 9 is the structure of FIG. 6 after deposition of a dielectric layer over the silicide and the sidewall spacer.

Referring now to FIG. 9, therein is shown the structure of FIG. 6 after deposition of a dielectric layer 900 over the silicide layers 600, 602, and 604, and the sidewall spacer 200. The dielectric layer 900 is deposited in known fashion and may consist, for example, of an appropriate known material having a dielectric constant suitable for the application at hand.

Figure 10:
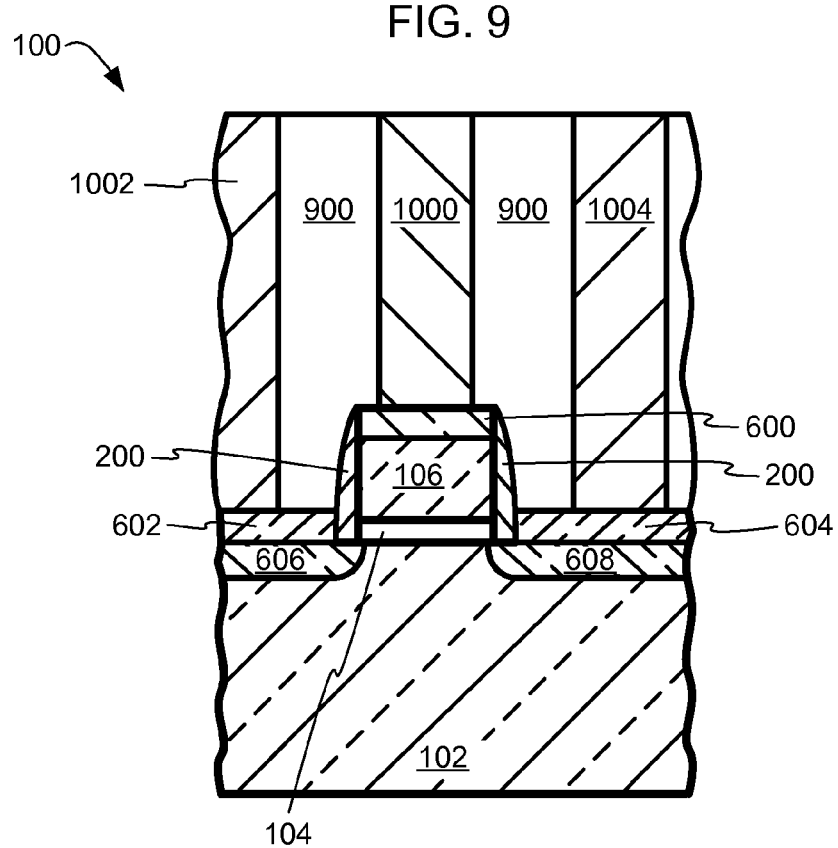
FIG. 10 is the structure of FIG. 9 after formation of metal contacts.

Referring now to FIG. 10, therein is shown the structure of FIG. 9 after formation of metal contacts 1000, 1002, and 1004. The metal contacts 1000, 1002, and 1004 are respectively electrically connected to the silicide layers 600, 602, and 604, and respectively to the gate 106 and the S/D regions 606 and 608.

In various embodiments, the metal contacts 1000, 1002, and 1004 are of metals such as tantalum (Ta), titanium (Ti), tungsten (W), alloys thereof, and compounds thereof. In other embodiments, the metal contacts 1000, 1002, and 1004 are of metals such as copper (Cu), gold (Au), silver (Ag), alloys thereof, compounds thereof, and combinations thereof with one or more of the above elements with diffusion barriers around them.

Figure 11:
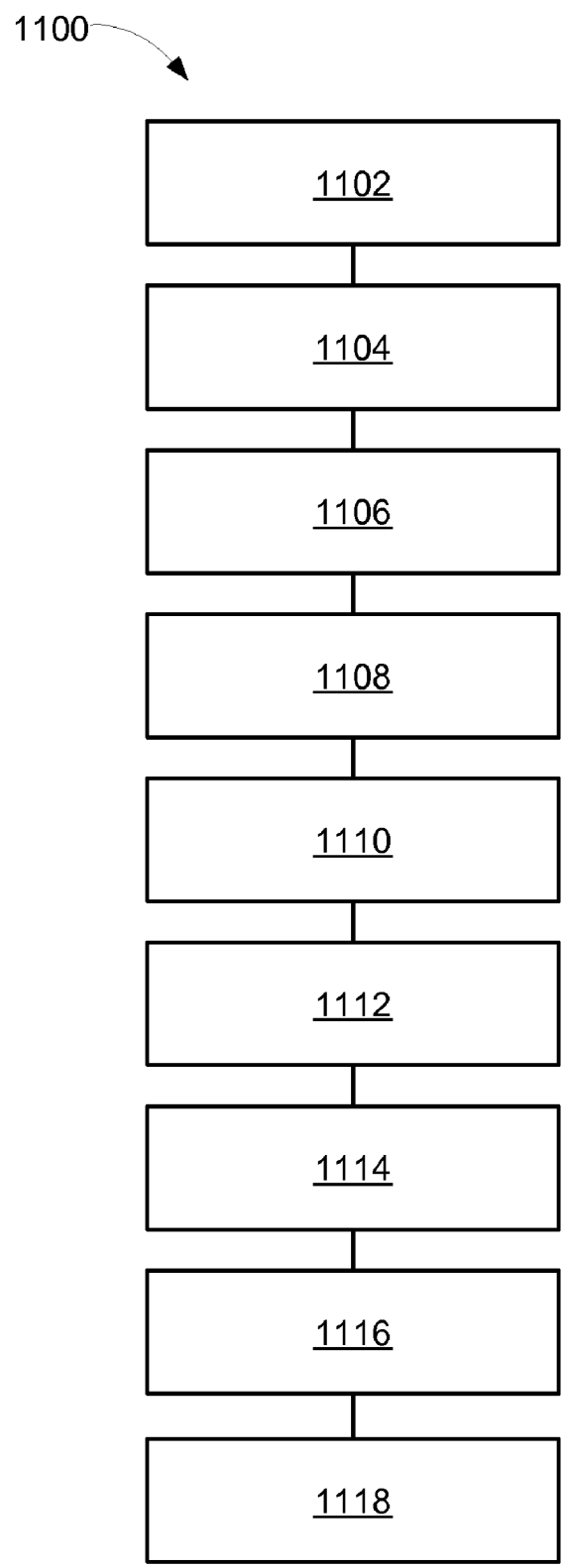
FIG. 11 is a simplified flow chart of the method of forming a device in accordance with the present invention.

Referring now to FIG. 11, therein is shown a simplified flow chart of a method 1100 in accordance with the present invention. The method 1100 includes: providing a semiconductor substrate in a step 1102; forming a gate dielectric on the semiconductor substrate in a step 1104; forming a gate on the gate dielectric in a step 1106; forming a sidewall spacer on the semiconductor substrate adjacent the gate and the gate dielectric in a step 1108; forming a thickening layer by selective epitaxial growth on the semiconductor substrate adjacent the sidewall spacer in a step 1110; forming raised source/drain dopant implanted regions in at least a portion of the thickening layer in a step 1112; forming silicide layers in at least a portion of the raised source/drain dopant implanted regions to form source/drain regions, beneath the silicide layers, that are enriched with dopant from the silicide layers in a step 1114; depositing a dielectric layer over the silicide layers in a step 1116; and forming contacts in the dielectric layer to the silicide layers in a step 1118.

It has thus been discovered that the present invention provides numerous advantages. For example, it furnishes a highly efficient and economical ion implantation and siliciding method for the formation of abrupt, shallow, high concentration integrated circuit source and drain junctions.

Another advantage is that, as the silicide grows and injects excess dopant into the silicon in front of it, it may also inject vacancies that may improve the chances that the dopant will end up in substitutional sites of the silicon lattice and become activated.

Thus, it has been discovered that the method and resulting structures of the present invention furnish important and heretofore unavailable solutions, capabilities, and functional advantages for forming abrupt junctions in integrated circuit devices by using a silicide growth dopant snowplow effect.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method of forming a device comprising:
   providing a semiconductor substrate;
   forming a gate dielectric on the semiconductor substrate;
   forming a gate on the gate dielectric;
   forming a sidewall spacer on the semiconductor substrate adjacent the gate and the gate dielectric;
   forming a thickening layer by selective epitaxial growth on the semiconductor substrate adjacent the sidewall spacer;
   forming raised source/drain dopant implanted regions in at least a portion of the thickening layer;
   forming silicide layers in at least a portion of the raised source/drain dopant implanted regions to form source/drain regions, beneath the silicide layers, that are enriched with dopant from the silicide layers;
   depositing a dielectric layer over the silicide layers; and
   forming contacts in the dielectric layer to the silicide layers.

2. The method as claimed in claim 1 wherein forming the raised source/drain dopant implanted regions further comprises implanting dopant into the thickening layer and the adjacent top of the semiconductor substrate.

3. The method as claimed in claim 1 wherein forming silicide layers in the raised source/drain dopant implanted regions further comprises:
   depositing metallic layers on the raised source/drain dopant implanted regions; and
   forming silicide layers by thermal silicidation of the metallic layers into the material of the raised source/drain dopant implanted regions.

4. The method as claimed in claim 1 wherein forming silicide layers in the raised source/drain dopant implanted regions to form source/drain regions therebeneath that are enriched with dopant from the silicide layers further comprises forming source/drain regions that are enriched with a dopant profile that is steeper than the profile of the dopant as it was originally implanted.

5. The method as claimed in claim 1 wherein forming raised source/drain dopant implanted regions further comprises implanting the regions with a dopant selected from a group consisting of arsenic, phosphorus, antimony, boron, indium, and a combination thereof.

6. The method as claimed in claim 1 wherein forming silicide layers further comprises depositing a metallic layer selected from a group consisting of cobalt, nickel, titanium, hafnium, platinum, and a combination thereof.

7. A method of forming a device comprising:
   providing a semiconductor substrate;
   forming a gate dielectric on the semiconductor substrate;
   forming a gate on the gate dielectric;
   forming a sidewall spacer on the semiconductor substrate adjacent the gate and the gate dielectric;
   forming a thickening layer by selective epitaxial growth of silicon on the surface of the semiconductor substrate adjacent the sidewall spacer and the gate;
   forming raised source/drain dopant implanted regions in at least a portion of the thickening layer and the adjacent top of the semiconductor substrate;
   forming silicide layers in at least a portion of the raised source/drain dopant implanted regions to form source/drain regions, beneath the silicide layers, that are enriched with dopant from the silicide layers;
   forming a silicide layer on the gate;
   depositing a dielectric layer over the silicide layers; and
   forming contacts in the dielectric layer to the silicide layers.

8. The method as claimed in claim 7 wherein forming the raised source/drain dopant implanted regions further comprises implanting dopant into the thickening layer and the adjacent top of the semiconductor substrate.

9. The method as claimed in claim 7 wherein forming silicide layers in the raised source/drain dopant implanted regions further comprises:
   depositing metallic layers on the raised source/drain dopant implanted regions; and
   forming silicide layers by thermal silicidation of the metallic layers into the silicon material of the raised source/drain dopant implanted regions.

10. The method as claimed in claim 7 wherein forming silicide layers in the raised source/drain dopant implanted regions to form source/drain regions therebeneath that are enriched with dopant from the silicide layers further comprises forming source/drain regions that are enriched with a dopant profile that is steeper than the profile of the dopant as it was originally implanted.

11. The method as claimed in claim 7 wherein forming raised source/drain dopant implanted regions further comprises implanting the regions with a dopant selected from a group consisting of arsenic, phosphorus, antimony, boron, indium, and a combination thereof.

12. The method as claimed in claim 7 wherein forming silicide layers further comprises depositing a metallic layer selected from a group consisting of cobalt, nickel, titanium, hafnium, platinum, and a combination thereof.

* * * * *